(12) United States Patent
Liaw

(10) Patent No.: US 8,976,573 B2
(45) Date of Patent: Mar. 10, 2015

(54) APPARATUS FOR SRAM CELLS

(75) Inventor: Jhon-Jhy Liaw, Zhudong Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 176 days.

(21) Appl. No.: 13/446,220

(22) Filed: Apr. 13, 2012

(65) Prior Publication Data

US 2013/0272056 A1    Oct. 17, 2013

(51) Int. Cl.
*G11C 5/02*    (2006.01)

(52) U.S. Cl.
USPC ............................................................ 365/154

(58) Field of Classification Search
CPC ........................................................ G11C 5/02
USPC ........................................................ 365/154
See application file for complete search history.

(56) References Cited

U.S. PATENT DOCUMENTS

| | | | | |
|---|---|---|---|---|
| 2004/0023449 A1* | 2/2004 | Hsu et al. | | 438/152 |
| 2007/0050743 A1* | 3/2007 | Batra | | 716/10 |
| 2009/0059640 A1* | 3/2009 | Funane et al. | | 365/51 |
| 2011/0018064 A1* | 1/2011 | Doornbos | | 257/365 |
| 2011/0068400 A1 | 3/2011 | Wang et al. | | |
| 2011/0157965 A1* | 6/2011 | Nii | | 365/156 |
| 2011/0182098 A1 | 7/2011 | Liaw | | |
| 2011/0317485 A1 | 12/2011 | Liaw | | |
| 2013/0026580 A1* | 1/2013 | Morimoto et al. | | 257/369 |
| 2013/0077375 A1* | 3/2013 | Liaw | | 365/72 |

FOREIGN PATENT DOCUMENTS

KR    20110088336 A    8/2011

* cited by examiner

*Primary Examiner* — Hoai V Ho
*Assistant Examiner* — Min Huang
(74) *Attorney, Agent, or Firm* — Slater & Matsil, L.L.P.

(57) ABSTRACT

A memory cell comprises a first word line in a first interconnect layer, a first VSS line, a first bit line, a power source line, a second bit line and a second VSS line formed a second interconnect layer, a second word line in a third interconnect layer. The memory cell further comprises a word line strap structure formed between the power source line and the second bit line, wherein the word line strap structure couples the first word line and the second word line.

20 Claims, 19 Drawing Sheets

APPARATUS FOR SRAM CELLS

BACKGROUND

Modern electronic devices such as a notebook computer comprise a variety of memories to store information. Memory circuits include two major categories. One is volatile memories; the other is non-volatile memories. Volatile memories include random access memory (RAM), which can be further divided into two sub-categories, static random access memory (SRAM) and dynamic random access memory (DRAM). Both SRAM and DRAM are volatile because they will lose the information they store when they are not powered. On the other hand, non-volatile memories can keep data stored on them. Non-volatile memories include a variety of sub-categories, such as read-only-memory (ROM), electrically erasable programmable read-only memory (EEPROM) and flash memory.

Static random access memory (SRAM) is commonly used in integrated circuits. SRAM cells have the advantageous feature of holding data without a need for refreshing. SRAM cells may include different numbers of transistors, and are often referred to by the number of transistors, for example, six-transistor (6T) SRAM, eight-transistor (8T) SRAM, and the like. The transistors typically form a data latch for storing a bit. Additional transistors may be added to control access to the transistors. SRAM cells are typically arranged as an array having rows and columns. Each row of the SRAM cells is connected to a word line, which determines whether the current SRAM cell is selected or not. Each column of the SRAM cells is connected to a bit line (or a pair of complementary bit lines), which is used for writing a bit into, or reading a bit from, the SRAM cell.

The SRAM industry has experienced rapid growth due to continuous improvements in the integration density of a variety of electronic components. For the most part, this improvement in integration density has come from repeated reductions in minimum feature size, which allows more components to be integrated into a given area. However, the smaller feature size may lead to more leakage current. As the demand for even smaller electronic devices has grown recently, there has grown a need for reducing leakage current of transistors of SRAM cells.

As semiconductor technologies evolve, fin field effect transistors (FinFETs) have emerged as an effective alternative to further reduce leakage current in semiconductor devices. In a FinFET, an active region including the drain, the channel region and the source protrudes up from the surface of the semiconductor substrate upon which the FinFET is located. The active region of the FinFET, like a fin, is rectangular in shape from a cross section view. In addition, the gate structure of the FinFET wraps the active region around three sides like an upside-down U. As a result, the gate structure's control of the channel has become stronger. The short channel leakage effect of conventional planar transistors has been reduced. As such, when the FinFET is turned off, the gate structure can better control the channel so as to reduce leakage current of the FinFET.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the embodiments of the disclosure, and do not limit the scope of the disclosure.

The present disclosure will be described with respect to embodiments in a specific context, a fin field effect transistor (FinFET) static random access memory (SRAM) memory structure. The embodiments of the disclosure may also be applied, however, to a variety of semiconductor devices. Hereinafter, various embodiments will be explained in detail with reference to the accompanying drawings.

Figure 1:
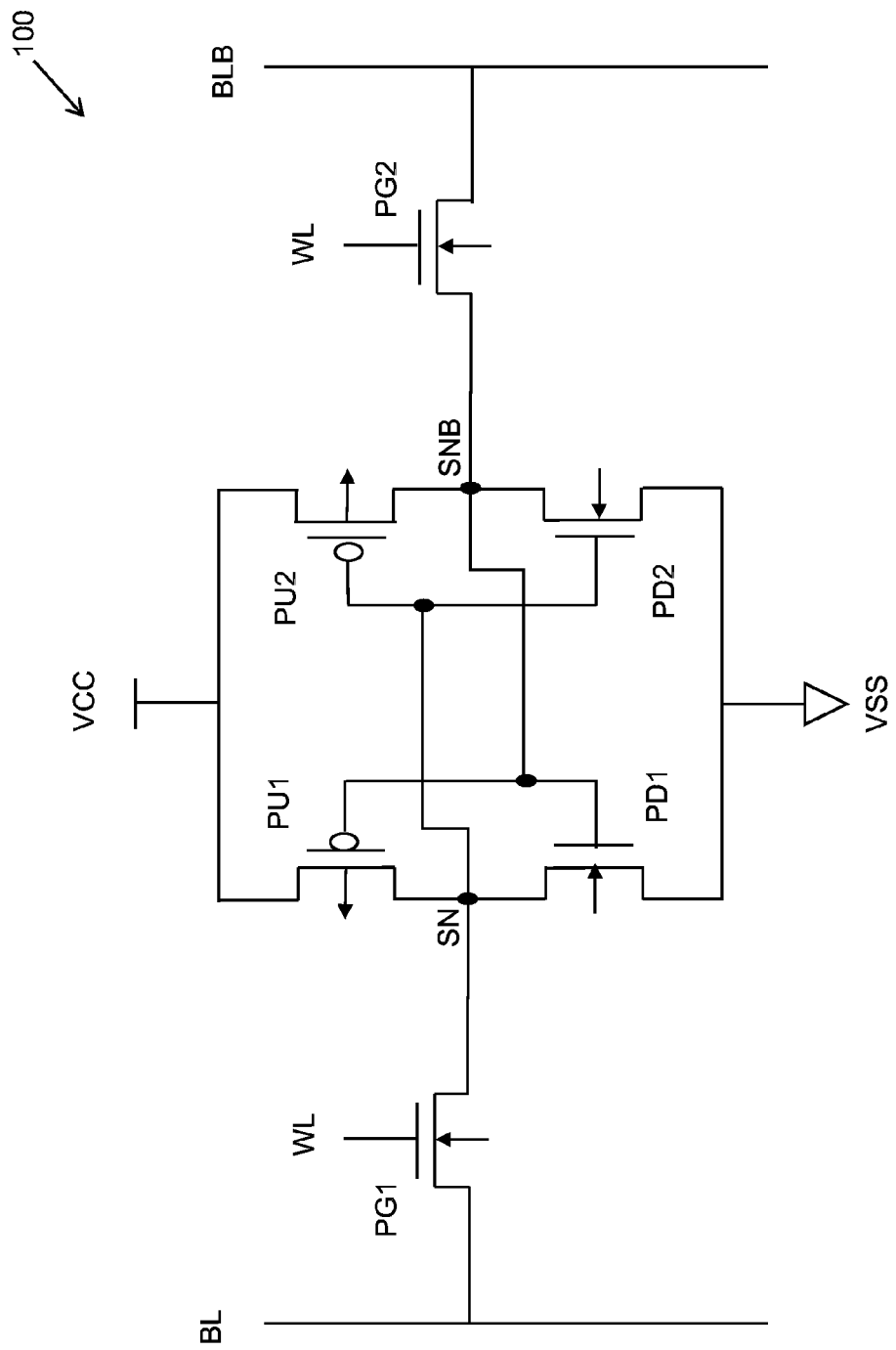
FIG. 1 illustrates a circuit diagram of a six transistor (6T) SRAM cell according to an embodiment.

FIG. 1 illustrates a circuit diagram of a six transistor (6T) SRAM cell according to an embodiment. The SRAM cell 100 comprises a first inverter formed by a pull-up p-type metal oxide semiconductor (PMOS) transistor PU1 and a pull-down n-type metal oxide semiconductor (NMOS) transistor PD1. The SRAM cell 100 further comprises a second inverter formed by a pull-up PMOS transistor PU2 and a pull-down NMOS transistor PD2. Furthermore, both the first inverter and second inverter are coupled between a voltage bus VCC and a ground potential VSS.

As shown in FIG. 1, the first inverter and the second inverter are cross-coupled. That is, the first inverter has an input connected to the output of the second inverter. Likewise, the second inverter has an input connected to the output of the first inverter. The output of the first inverter is referred to as a storage node SN. Likewise, the output of the second inverter is referred to as a storage node SNB. In a normal operating mode, the storage node SN is in the opposite logic state as the storage node SNB. By employing the two cross-coupled inverters, the SRAM cell 100 can hold the data using a latched structure so that the stored data will not be lost without applying a refresh cycle.

In an SRAM array (not shown) using the 6T SRAM cells, the cells are arranged in rows and columns. The columns of the SRAM array are formed by a bit line pairs, namely a first bit line BL and a second bit line BLB. In addition, the cells of the SRAM array are disposed between the respective bit line pairs. As shown in FIG. 1, the SRAM cell 100 is placed between the bit line BL and the bit line BLB.

As shown in FIG. 1, the SRAM cell 100 comprises a first pass-gate transistor PG1 connected between the bit line BL and the output of the first inverter. The SRAM cell 100 further comprises a second pass-gate transistor PG2 connected between the bit line BLB and the output of the second inverter. The gates of the first pass-gate transistor PG1 and the second pass-gate transistor PG2 are connected to a word line (WL).

As shown in the circuit diagram of FIG. 1, transistors PU1, PU2 are p-type transistors. Transistors PU1 and PU2 can be implemented by a variety of p-type transistors such as planar p-type field effect transistors (PFETs), p-type fin field effect transistors (FinFETs) or the like. Transistors PD1, PD2, PG1, and PG2 are n-type transistors. Transistors PD1, PD2, PG1 and PG2 can be implemented by a variety of n-type transistors such as planar n-type field effect transistors (NFETs), n-type FinFETs or the like.

In operation, if the pass-gate transistors PG1 and PG2 are inactive, the SRAM cell 100 will maintain the complementary values at storage nodes SN and SNB indefinitely. This is so because each inverter of the pair of cross coupled inverters drives the input of the other, thereby maintaining the voltages at the storage nodes. This situation will remain stable until the power is removed from the SRAM, or, a write cycle is performed changing the stored data at the storage nodes.

During a WRITE operation, bit lines BL and BLB are set to opposite logic values according to the new data that will be written into the SRAM cell 100. For example, in an SRAM write operation, a logic state "1" stored in a data latch of the SRAM cell 100 can be reset by setting BL to "0" and BLB to "1". In response to a binary code from a row decoder (not shown), a word line coupled to the pass-gate transistors of the SRAM cell 100 is asserted so that the data latch is selected to proceed to a WRITE operation.

After the SRAM cell 100 is selected, both the first pass-gate transistor PG1 and the second pass-gate transistor PG2 are turned on. As a result, the storage nodes SN and SNB are connected to BL and BLB respectively. Furthermore, the storage node SN of the data latch is discharged by BL to "0" and the other storage node of the data latch is charged by BLB to "1". As a result, the new data logic "0" is latched into the SRAM cell 100.

In a READ operation, both BL and BLB of the SRAM cell 100 are pre-charged to a voltage approximately equal to the operating voltage of the memory bank in which the SRAM cell 100 is located. In response to a binary code from the row decoder, a word line coupled to the first pass-gate PG1 and the second pass-gate PG2 of the SRAM cell 100 is asserted so that the data latch is selected to proceed to a READ operation.

During a READ operation, through a turned on pass-gate transistors PG1 and PG2, one bit line coupled to the storage node storing a logic "0" is discharged to a lower voltage. Meanwhile, the other bit line remains the pre-charged voltage because there is no discharging path between the other bit line and the storage node storing a logic "1". The differential voltage between BL and BLB (approximately in a range from 50 to 300 mV) is detected by a sense amplifier (not shown). Furthermore, the sense amplifier amplifies the differential voltage and reports the logic state of the memory cell via a data buffer.

Figure 2:
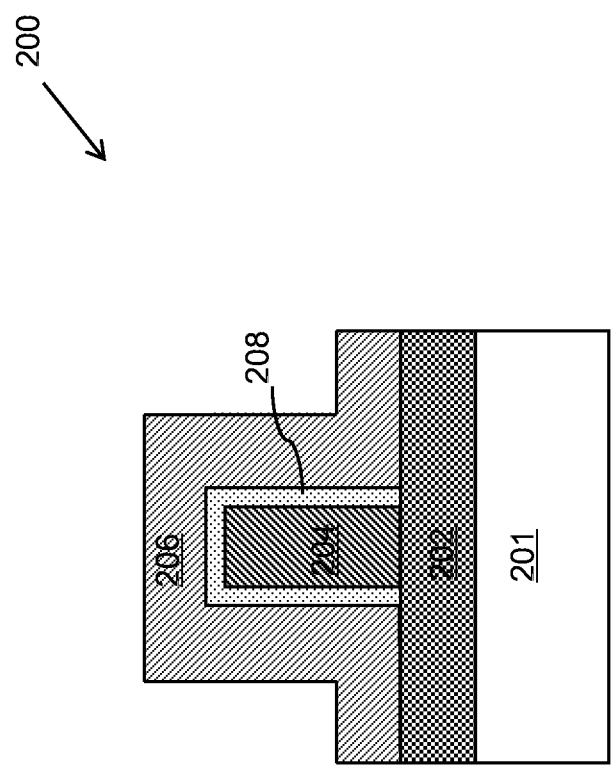
FIG. 2 illustrates a cross sectional view of a fin field effect transistor (FinFET) in accordance with an embodiment.

FIG. 2 illustrates a cross sectional view of a fin field effect transistor (FinFET) in accordance with an embodiment. The FinFET 200 is of a silicon-on-insulator (SOI) FinFET structure. In the FinFET 200, an active region 204 includes a drain, a source and a channel region coupled between the drain and the source. The active region 204 protrudes up from the surface of the semiconductor substrate 201 upon which the FinFET is located. The active region 204 of the FinFET 200, like a fin, is rectangular in shape from a cross section view. In addition, the gate structure 206 of the FinFET 200 wraps the active region 204 around three sides like an upside-down U.

In accordance with an embodiment, the FinFET 200 comprises a substrate 201 and an SOI layer 202 formed over the substrate 201. In other words, the substrate 201 and the SOI layer 202 form an SOI substrate. In accordance with an embodiment, the SOI layer 202 is formed of silicon dioxide. The substrate 201 may be formed of silicon, although it may also be formed of other group III, group IV, and/or group V elements, such as silicon, germanium, gallium, arsenic, and combinations thereof. In accordance with an embodiment, the substrate 201 may be a lightly doped n-type substrate, which is formed by implanting n-type dopants such as phosphorous at a concentration of between about $5 \times 10^{16}/cm^3$ and about $9 \times 10^{18}/cm^3$.

As shown in FIG. 2, there may be a gate dielectric layer 208 formed between the active region 204 and the gate structure 206. The gate dielectric layer 208 may be formed of oxide materials and formed by suitable oxidation processes such as wet or dry thermal oxidation, sputtering or by CVD techniques using tetra-ethyl-ortho-silicate (TEOS) and oxygen as a precursor. In addition, the gate dielectric layer 208 may be a high-K dielectric material (K>10), such as silicon oxide, silicon oxynitride, silicon nitride, an oxide, a nitrogen-containing oxide, aluminum oxide, lanthanum oxide, hafnium oxide, zirconium oxide, hafnium oxynitride, a combination thereof, or the like.

The gate structure 206 may comprise a conductive material selected from a group comprising of polycrystalline-silicon (poly-Si), poly-crystalline silicon-germanium (poly-SiGe), metal materials, metal silicide materials, metal nitride materials, metal oxide materials and the like. For example, metal materials may include tantalum, titanium, molybdenum, tungsten, platinum, aluminum, hafnium, ruthenium, a combination thereof and the like. Metal silicide materials include titanium silicide, cobalt silicide, nickel silicide, tantalum silicide, a combination thereof and the like. Metal nitride materials include titanium nitride, tantalum nitride, tungsten nitride, a combination thereof and the like. Metal oxide materials include ruthenium oxide, indium tin oxide, a combination thereof and the like.

It should be noted that other fabrication processes may be used to form the gate structure 206. Other fabrication processes include but is not limited to CVD, physical vapor deposition (PVD), plasma enhanced CVD (PECVD), atmospheric pressure CVD (APCVD), high density plasma CVD (HD CVD), low-pressure chemical vapor deposition (LPCVD), atomic layer CVD (ALCVD) and the like.

Figure 3:
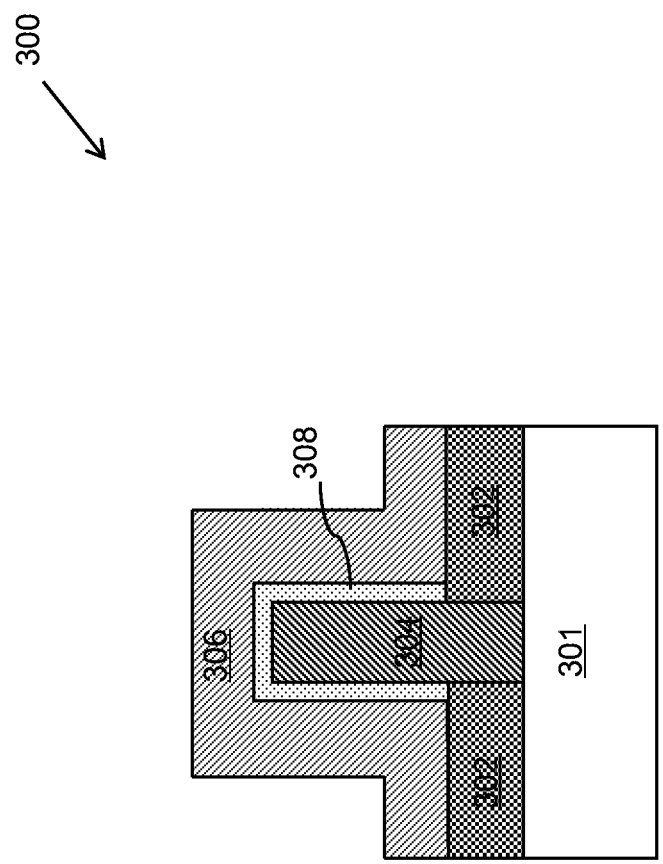
FIG. 3 illustrates a cross sectional view of a fin field effect transistor (FinFET) in accordance with another embodiment.

FIG. 3 illustrates a cross sectional view of a fin field effect transistor (FinFET) in accordance with another embodiment. The FinFET 300 is of a bulk FinFET structure. The gate 306, the gate dielectric layer 308 and the active region 304 are similar to those shown in FIG. 2, and hence are not discussed in further detail herein. In accordance with an embodiment, the substrate 301 may be a crystalline structure. The substrate 301 may be formed of silicon, although it may also be formed of other group III, group IV, and/or group V elements, such as silicon, germanium, gallium, arsenic, and combinations thereof.

In accordance with an embodiment, the FinFET 300 may comprise an isolation region 302. As shown in FIG. 3, the bottom portion of the active region 304 is enclosed by the isolation region 302. The isolation region 302 may be implemented by an STI structure. The STI structure (e.g., isolation region 302) may be fabricated by using suitable techniques including photolithography and etching processes. In particular, the photolithography and etching processes may comprise depositing a commonly used mask material such as photoresist over the substrate 301, exposing the mask material to a pattern, etching the substrate 301 in accordance with the pattern. In this manner, a plurality of openings may be formed as a result. The openings are then filled with dielectric materials to form the STI structures (e.g., isolation regions 302). In accordance with an embodiment, the isolation regions may be filled with a dielectric material such as an oxide material, a high-density plasma (HDP) oxide or the like. A chemical mechanical polishing (CMP) process is then performed to remove excess portions of the dielectric materials, and the remaining portions are the isolation region 302.

As shown in FIG. 3, the isolation region 302 may be portions of a continuous region, which may form an isolation ring in accordance with an embodiment. Alternatively, the isolation region 302 may be two separate isolation regions having their sidewalls facing each other.

Figure 4:
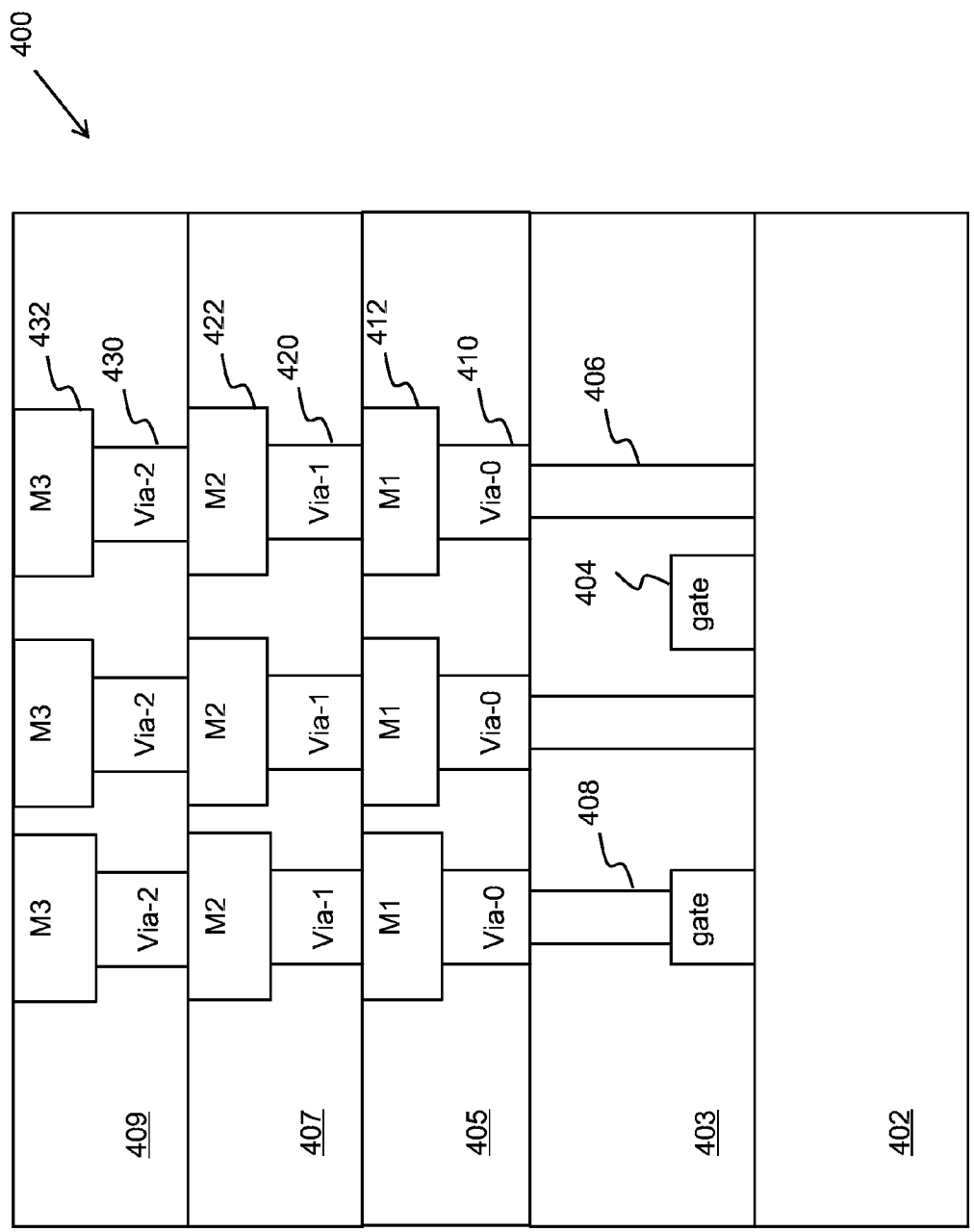
FIG. 4 illustrates a cross sectional view of a semiconductor device having a single contact structure in accordance with an embodiment.

FIG. 4 illustrates a cross sectional view of a semiconductor device having a single contact structure in accordance with an embodiment. The semiconductor device 400 includes a substrate 402 and a plurality of transistors (not shown) formed in the substrate. A gate 404 of a transistor is formed over the substrate 402. The gate 404 may comprise a gate electrode and a gate dielectric layer (not shown respectively).

As shown in FIG. 4, an inter-layer dielectric (ILD) layer 403 is formed over the substrate 402. The ILD layer 403 may comprise a material such as boron phosphorous silicate glass (BPSG), although any suitable dielectrics may be used for either layer. The ILD layer 403 may be formed using a process such as PECVD, although other processes, such as LPCVD, may alternatively be used.

There may be a plurality of contacts 406 and 408 coupled to the gate electrode 404 and other active regions such as a drain/source region (not shown). The contacts 406 and 408 may be formed through the ILD layer 403 with suitable photolithography and etching techniques. Generally, these photolithography techniques involve depositing a photoresist material, which is masked, exposed, and developed to expose portions of the ILD layer 403 that are to be removed. The remaining photoresist material protects the underlying material from subsequent processing steps, such as etching. The etching process may form trenches. The trenches may be filled with conductive materials to form contacts.

The contacts 406 and 408 may comprise a barrier/adhesion layer (not shown) to prevent diffusion and provide better adhesion for the contacts 406 and 408. In an embodiment, the barrier layer is formed of one or more layers of titanium, titanium nitride, tantalum, tantalum nitride, or the like. The barrier layer may be formed through chemical vapor deposition, although other techniques could alternatively be used.

The contacts 406 and 408 may be formed of any suitable conductive material, such as a highly-conductive, low-resistive metal, elemental metal, transition metal, or the like. In accordance with an embodiment, the contacts 406 and 408 are formed of tungsten, although other materials, such as Cu, Al, AlCu, TiN, TiW, Ti, TaN, Ta, Pt, or any combination thereof, could alternatively be utilized. In an embodiment in which the contacts 406 and 408 are formed of tungsten, the contacts 406 and 408 may be deposited by CVD techniques known in the art, although any method of formation could alternatively be used.

After the contacts 406 and 408 are formed, there may be a plurality of interconnect layers formed over the ILD layer 403. For simplicity, only three interconnect layers are illustrated to represent the inventive aspects of various embodiments. A first interconnect layer 405 is formed over the ILD layer 403. As shown in FIG. 4, the first interconnect layer 405 may comprise the first vias 410 and first metal lines 412. The first vias 410 and first metal lines 412 may be made through any suitable formation process (e.g., lithography with etching, damascene, dual damascene, or the like) and may be formed using suitable conductive materials such as copper, aluminum, aluminum alloys, copper alloys or the like.

A second interconnect layer 407 is formed over the first interconnect layer 405. The second interconnect layer 407 may include second vias 420 and second metal lines 422. In accordance with an embodiment, the second vias 420 and the second metal lines 422 are formed of conductive materials such as copper aluminum, aluminum alloys, copper alloys or the like. As shown in FIG. 4, the second metal lines 422 are electrically coupled to the first metal lines 412 through the second vias 420.

A third interconnect layer 409 is formed over the second interconnect layer 407. The third interconnect layer 409 may include third vias 430 and third metal lines 432. In accordance with an embodiment, the third vias 430 and the third metal lines 432 are formed of conductive materials such as copper aluminum, aluminum alloys, copper alloys or the like. As shown in FIG. 4, the third metal lines 432 are electrically coupled to the second metal lines 422 through the third vias 430.

Figure 5:
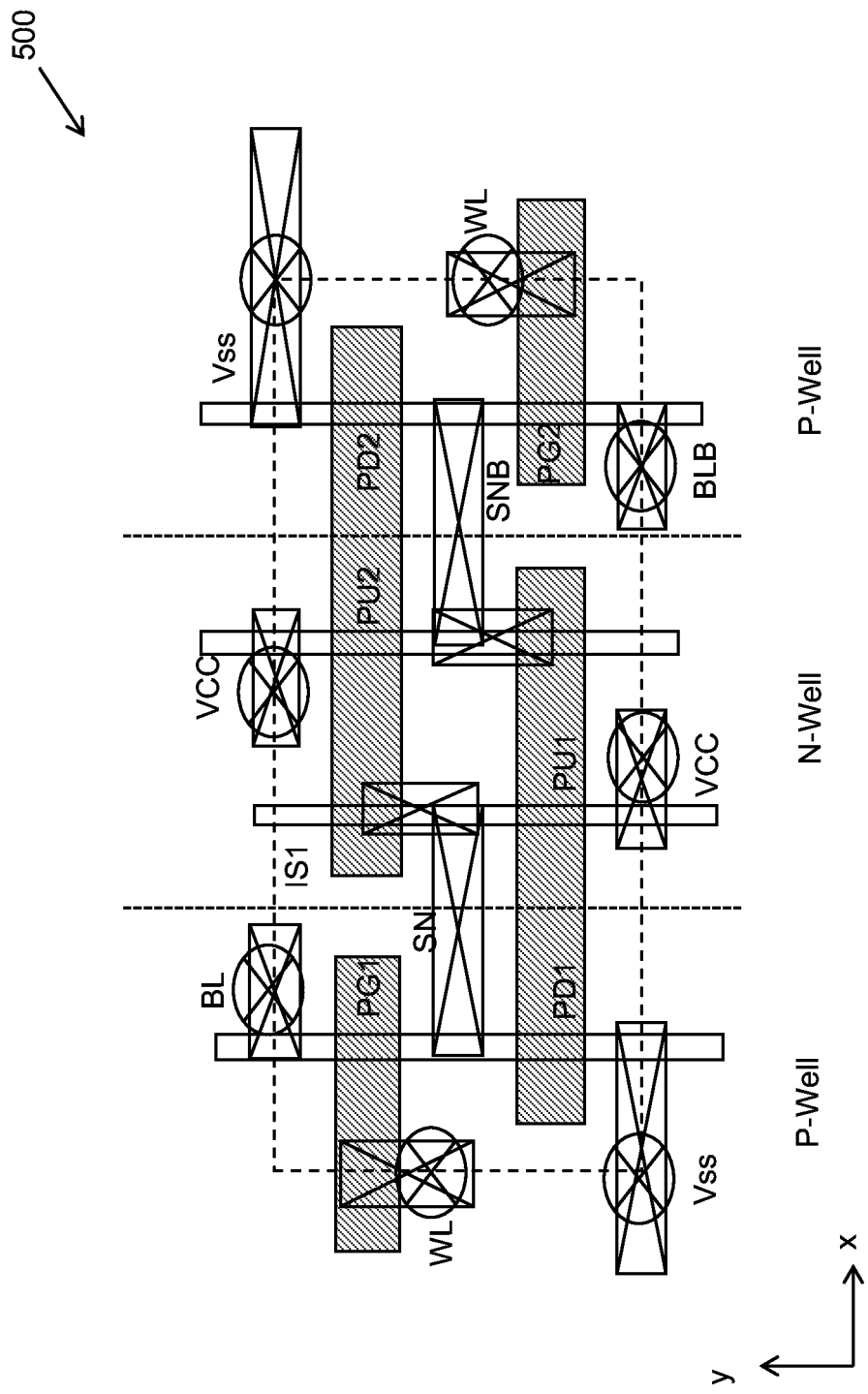
FIG. 5 illustrates a layout diagram of the SRAM cell shown in FIG. 1 in accordance with an embodiment.

FIG. 5 illustrates a layout diagram of the SRAM cell shown in FIG. 1 in accordance with an embodiment. As shown in FIG. 5, there may be four active areas, each of which is formed by a fin line. The active regions extend parallel in a y-direction shown in FIG. 5 across the width of the SRAM cell 500. FIG. 5 further illustrates four gate regions. The gate regions extend parallel in the x-direction shown in FIG. 5 along the length of the SRAM cell 500. In addition, the fin lines are orthogonal to the gate regions in the layout diagram. A transistor is formed at a cross point of a fin line and a gate region. As shown in FIG. 5, the six transistors of the SRAM cell are formed at different cross points. For example, the first pass-gate transistor PG1 is formed at the cross point of between the first fin line and the gate region labeled as PG1.

Two vertical dashed lines that intersect the SRAM cell 500 indicate boundaries between a p-type well in the substrate and an n-type well in the substrate in which respective fin transistors are formed. As person having ordinary skill in the art will readily understand that a drain/source region of a fin transistor is generally doped an opposite dopant type from the dopant type of the well in which the drain/source region is formed. For example, a source/drain region of a fin transistor is generally p-type doped when the well in which the active area is formed is an n-type well.

As shown in FIG. 5, the active areas of transistors PG1 and PD1 is formed in a p-type well. As a result, these transistors are n-type transistors. The active areas of transistors PU1 and PU2 are formed in an n-type well. As a result, these transistors are p-type transistors. The active areas of transistors PD2 and PG2 are formed in a p-type well. Similarly, these transistors are n-type transistors.

As shown in FIG. 5, a single gate region is used as the gates of transistors PD1 and PU1. Another single gate region is used as the gates of transistors PD2 and PU2. In this manner, each single gate region electrically couples the gates of the respective two transistors. In FIG. 5, a single gate region is dedicated to the pass-gate transistor PG1. Another single gate region is dedicated to the pass-gate transistor PG2. However, a person skilled in the art should recognize that the single gate region dedicated to the pass-gate transistor PG1 may extend beyond a cell boundary so that the gate region can be shared by an adjacent SRAM cell (not shown), as does the gate region for the pass-gate transistor PG2.

Various contacts and their corresponding interconnect vias may be employed to couple components in the SRAM cell 500. Through a via and a gate contact, a word line contact WL may be coupled to the gate of pass-gate transistor PG1, and another word line contact WL is coupled to the gate of pass-gate transistor PG2. Likewise, a bit line contact BL is coupled to the drain of pass-gate transistor PG1, and a complementary bit line contact BLB is coupled to the drain of pass-gate transistor PG2.

A power source contact VCC is coupled to the source of the pull-up transistor PU1, and another power source contact VCC is coupled to the source of the pull-up transistor PU2. A ground contact VSS is coupled to the source of the pull-down transistor PD1, and another ground contact VSS is coupled to the source of the pull-down transistor PD2. A storage node contact SN couples together the source of transistor PG1 and the drains of transistors PD1 and PU1. Another storage node contact SNB couples together the source of transistor PG2, and the drains of transistors PD2 and PU2.

Figure 6:
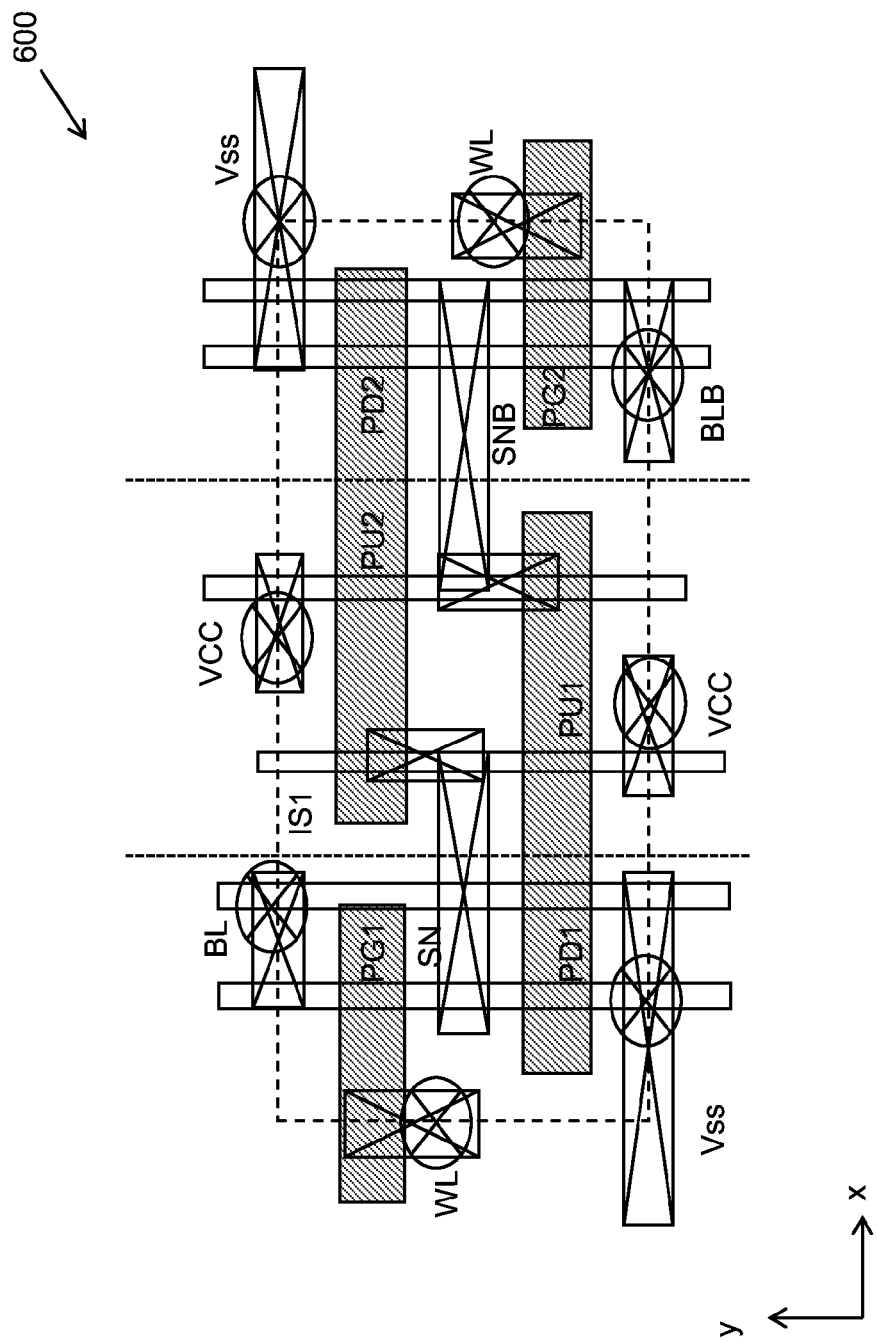
FIG. 6 illustrates a layout diagram of the SRAM cell shown in FIG. 1 in accordance with another embodiment.

FIG. 6 illustrates a layout diagram of the SRAM cell shown in FIG. 1 in accordance with another embodiment. The layout diagram of FIG. 6 is similar to that of FIG. 5 except that the transistors in the p-type wells are formed by two active areas. In FIG. 6, two active areas extend across the width of the cell in a p-type well to form components of transistors PG1 and PD1, and similarly, two active areas extend across the width of the cell in a p-type well to form components of transistors PG2 and PD2. Various modifications can be made to contacts and gates to extend to cover and/or contact appropriate components. One advantageous feature of having transistors PG1, PD1, PD2, and PG2 formed by two active regions is that the channel width of each transistor can be effectively doubled, thereby increasing the driving ability of each transistor.

Figure 7:
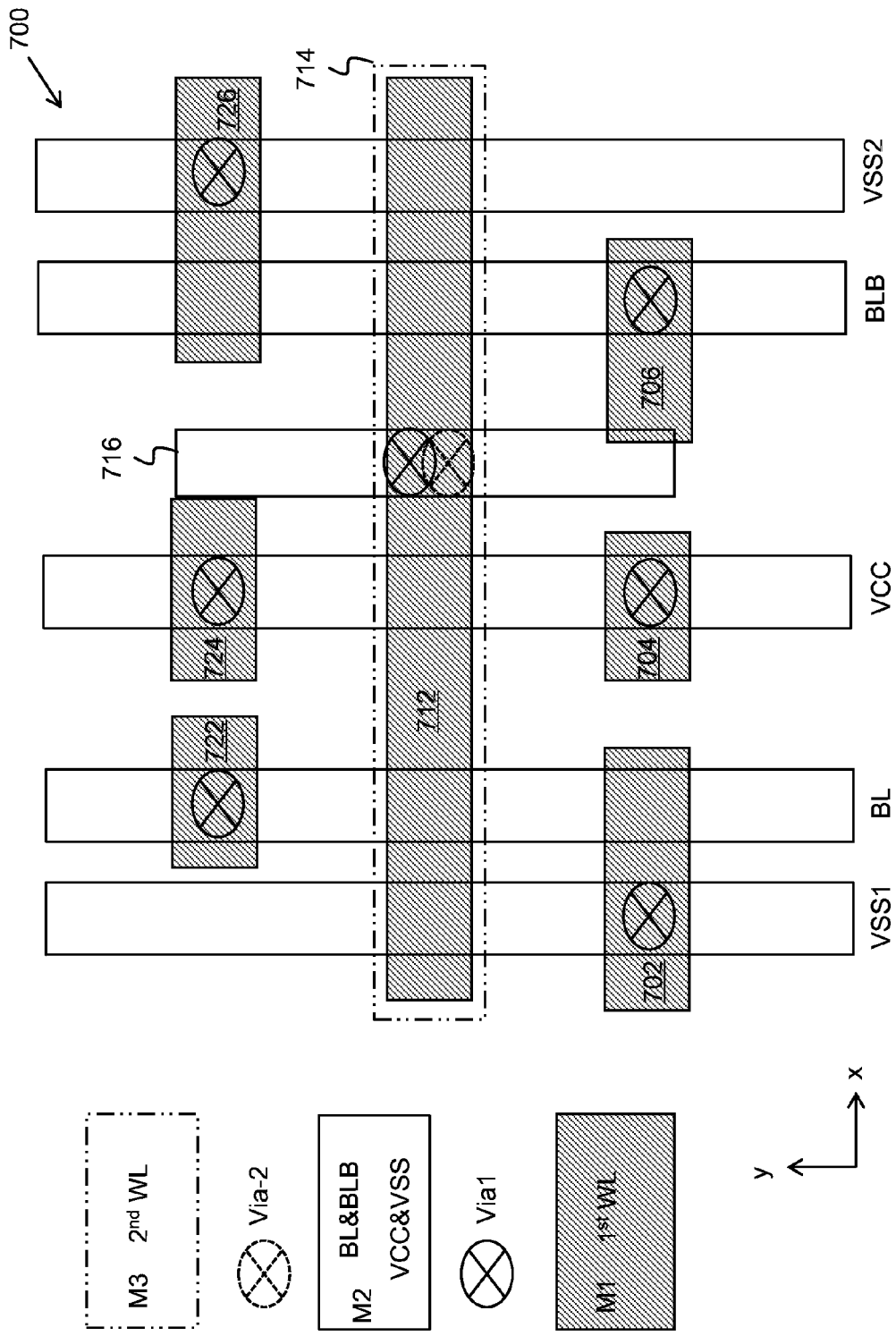
FIG. 7 illustrates a layout diagram of an SRAM cell in accordance with an embodiment.

FIG. 7 illustrates a layout diagram of an SRAM cell in accordance with an embodiment. Referring back to FIG. 1, the SRAM cell 100 may comprise a first VSS line, a second VSS line, a first bit line BL, a second bit line BLB and a power source line VCC. In FIG. 7, the five lines described above are formed in a second interconnect layer M2. More particularly, these five lines, namely VSS1, BL, VCC, BLB and VSS2, extend parallel in the y-axis shown in FIG. 7. The SRAM cell 700 further comprises a first word line and its corresponding landing pads. The first word line 712 and landing pads 702, 704, 706, 722, 724 and 726 are formed in the first interconnect layer M1. In comparison with the traditional layout diagram, the SRAM cell 700 further comprises a second word line 714 formed in a third interconnect layer M3. In addition, there may be a word line strap structure 716 formed between the first word line 712 and the second word line 714.

As shown in FIG. 7, in a top view, the word line strap structure 716 is formed between the power source line VCC and the second bit line BLB. The word line strap structure 716 may comprise a second via (e.g., Via-1 shown in FIG. 4) formed on top of the first interconnect layer M1, a second interconnect metal line and a third via (e.g., Via-2 shown in FIG. 4) formed on top of the second interconnect layer M2.

In accordance with an embodiment, the second via may be electrically coupled to the first word line 712. The third via 714 may be electrically coupled to the second word line 714. As a result, a conductive path formed by the second via, the second interconnect metal line and the third via couples the first word line 712 and the second word line 714. The word line strap structure 716 provides a low voltage drop electrical connection from a first word line 712 formed in the first interconnect layer M1 and a second word line 714 formed in the third interconnect layer M3.

Figure 8:
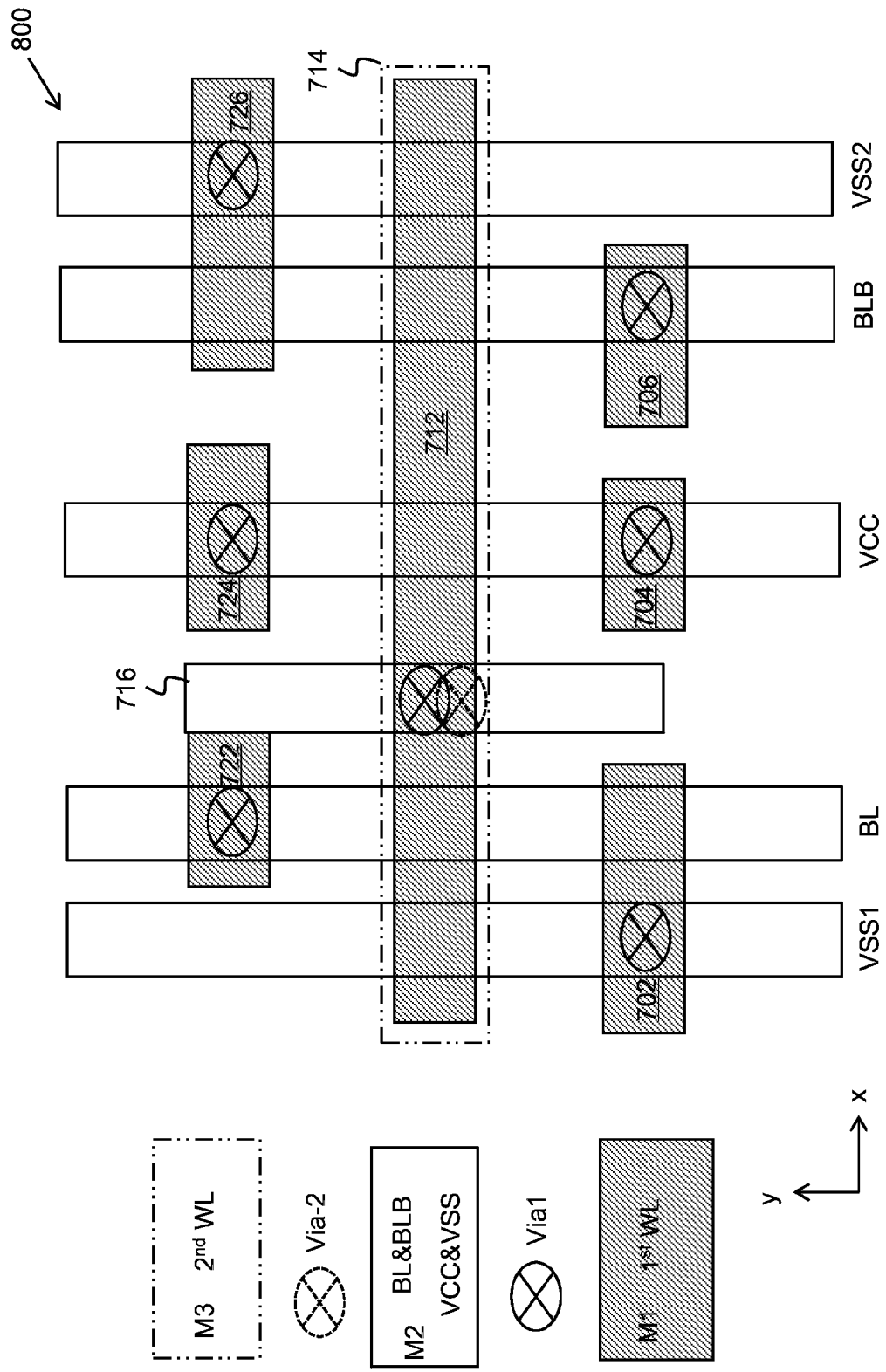
FIG. 8 illustrates a layout diagram of an SRAM cell in accordance with another embodiment.

FIG. 8 illustrates a layout diagram of an SRAM cell in accordance with another embodiment. The SRAM cell 800 of FIG. 8 is similar to the SRAM cell 700 shown in FIG. 7 except that a word line strap structure is not formed between the power source line VCC and the second bit line BLB. Instead, the word line strap structure 716 is formed between the power source line VCC and the first bit line BL. The function and advantage of having a word line strap structure has been described above with respect to FIG. 7, and hence is not discussed herein to avoid repetition.

Figure 9:
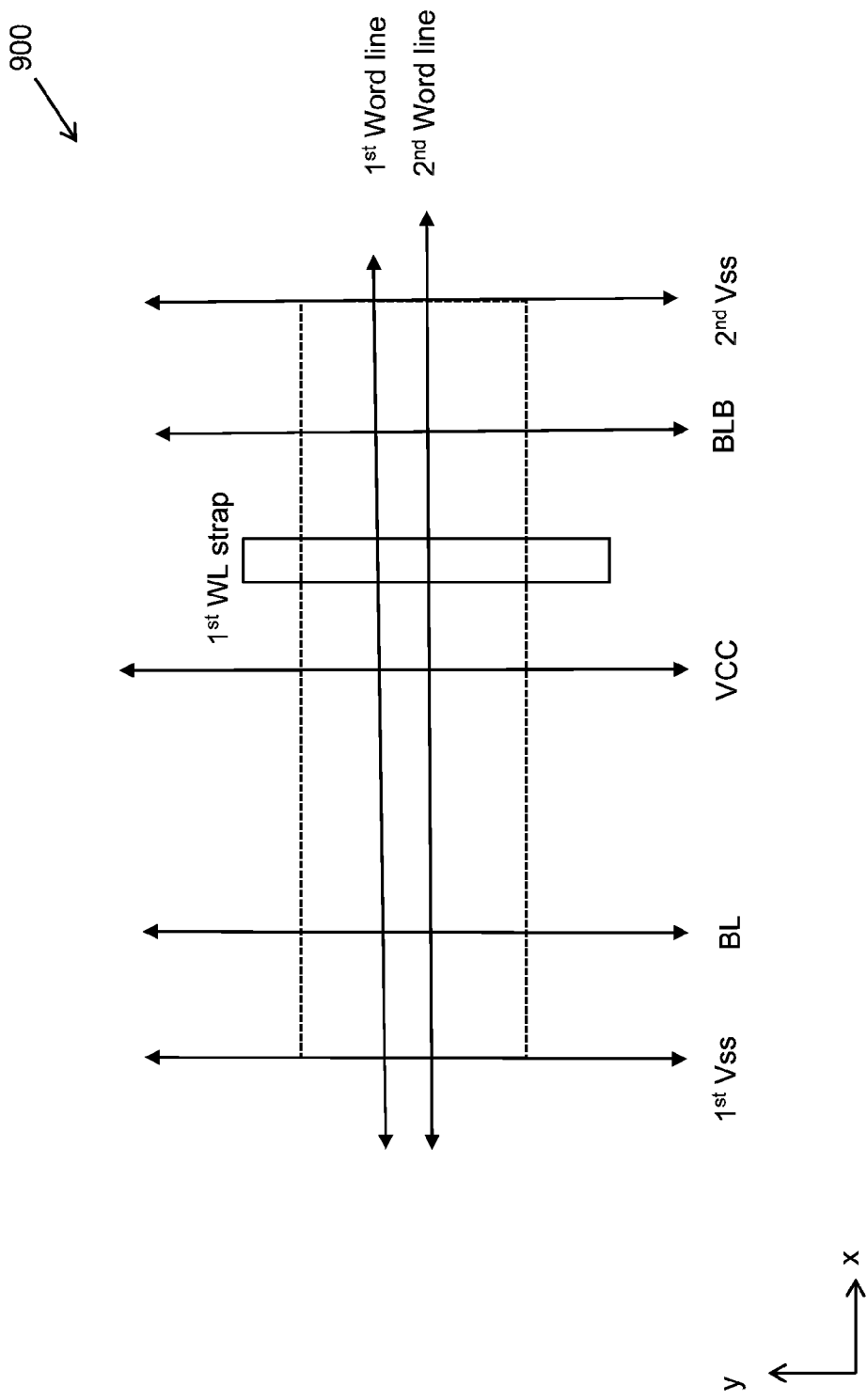
FIG. 9 illustrates a simplified layout diagram of the SRAM cell shown in FIG. 7 in accordance with an embodiment.

FIG. 9 illustrates a simplified layout diagram of the SRAM cell shown in FIG. 7 in accordance with an embodiment. As shown in FIG. 9, the first VSS line, the first bit line BL, the power source line VCC, the second bit line BLB and the second VSS line are formed from left to right. In addition, there five lines extend parallel in the y-direction as shown in FIG. 9. The SRAM cell further comprises a first word line and a second word line. The first word line and the second word line extend parallel in the x-direction shown in FIG. 9. In addition, the first word line and the second word line are formed in two different interconnect layers. A word line strap structure is formed between the power source line VCC and the second bit line BLB. The word line strap structure provides a low voltage drop connection between the first word line and the second word line.

Figure 10:
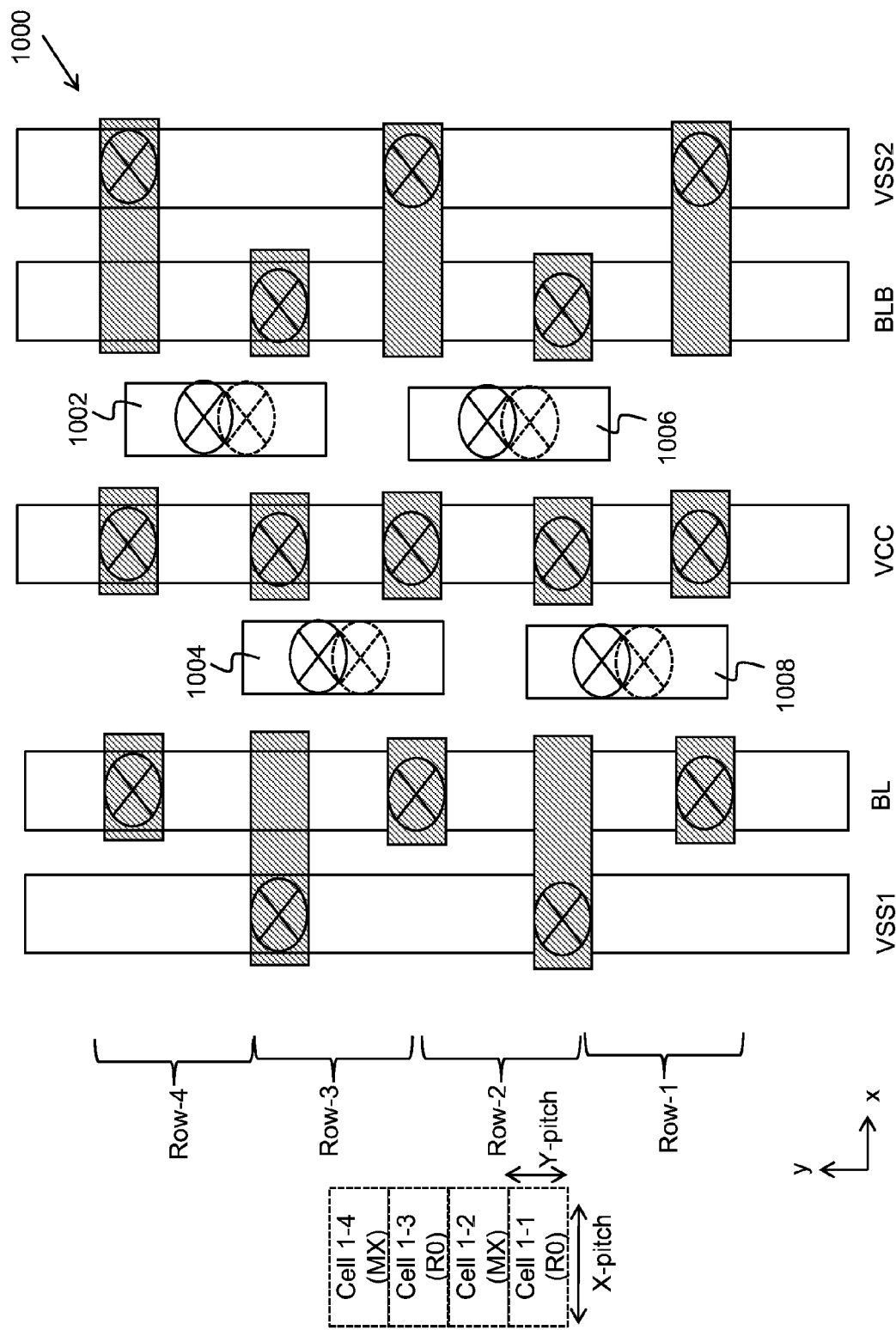
FIG. 10 illustrates a layout diagram of an SRAM array of four rows and one column in accordance with an embodiment.

FIG. 10 illustrates a layout diagram of an SRAM array of four rows and one column in accordance with an embodiment. Each SRAM cell of FIG. 10 is similar to the SRAM cell 700 shown in FIG. 7, and hence is not discussed in further detail herein. The SRAM array 1000 has one column and four rows of SRAM cells. As shown in FIG. 10, word line strap structures are formed in the SRAM array in an alternating manner. In particular, in the first row, the word line strap structure 1002 is formed between the power source line VCC and the second bit line BLB. In contrast, in the second row, the word line strap structure 1004 is formed between the power source line VCC and the first bit line BL.

Likewise, in the third row, the word line strap structure 1006 is formed between the power source line VCC and the second bit line BLB. In the fourth row, the word line strap structure 1008 is formed between the power source line VCC and the first bit line BL It should be noted that the SRAM cell shown in FIG. 10 may comprises the first word line formed in the second interconnect layer M2 and the second word line formed in the third interconnect layer M3. These two word lines have been described in detail with respect to FIG. 7. For simplicity, these two word lines are not illustrated in FIG. 10.

One advantageous of having word line strap structures arranged in an alternating manner is that the coupling capacitance at bit lines of two adjacent SRAM cells is better balanced. Such balanced coupling capacitance helps to further improve the speed and function of an SRAM array. In addition, the word line strap structures arranged in an alternating manner shown in FIG. 10 help to create more layout margins. For example, the metal lines of the word line strap structures may be formed from a single lithography patterning step such as a first lithography patterning step of a multiple lithography steps.

Figure 11:
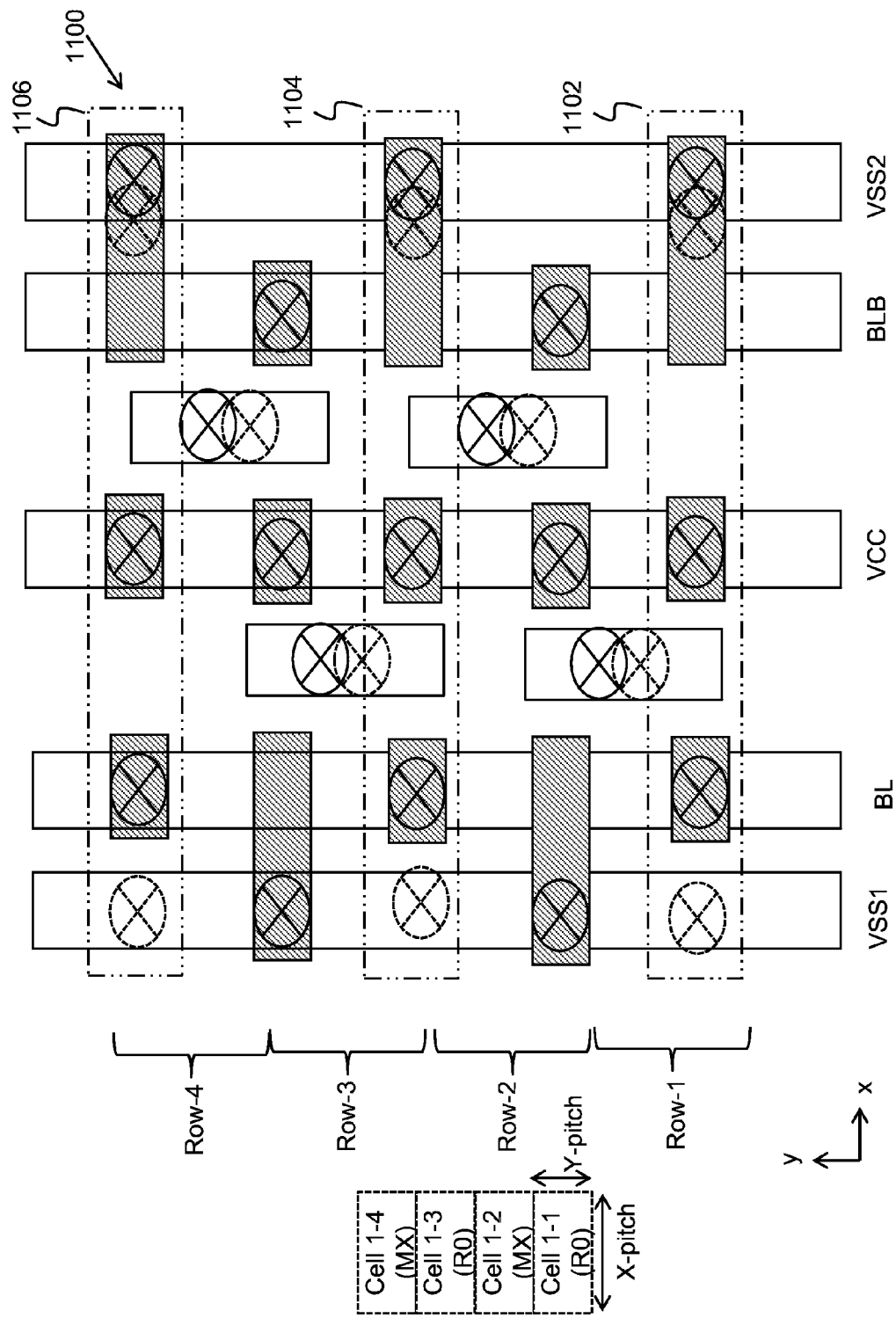
FIG. 11 illustrates a layout diagram of an SRAM array having four rows and one column in accordance with another embodiment.

FIG. 11 illustrates a layout diagram of an SRAM array having four rows and one column in accordance with another embodiment. The layout diagram of the SRAM array 1100 in FIG. 11 is similar to that of the SRAM array 1000 shown in FIG. 10 except that a plurality of third VSS lines 1102, 1104 and 1106 are employed. The third VSS line is formed in the third interconnect layer M3. As shown in FIG. 11, the third VSS line 1102 is formed in the first row. There are a plurality of third vias (e.g., Via-2 shown in FIG. 4) coupled between the third VSS line 1120, and the first VSS line VSS1 and the second VSS line VSS2 formed in the second interconnect layer M2.

Likewise, third VSS lines 1104 and 1106 are formed in the third interconnect layer M3. A plurality of third vias couple the third VSS lines 1104 and 1106 with the first and second VSS lines. An advantageous feature of having the third VSS lines is that the third VSS lines further reduce the resistance as well as the voltage drop of the SRAM circuit so that the function and speed of the SRAM array may be improved as a result.

Figure 12:
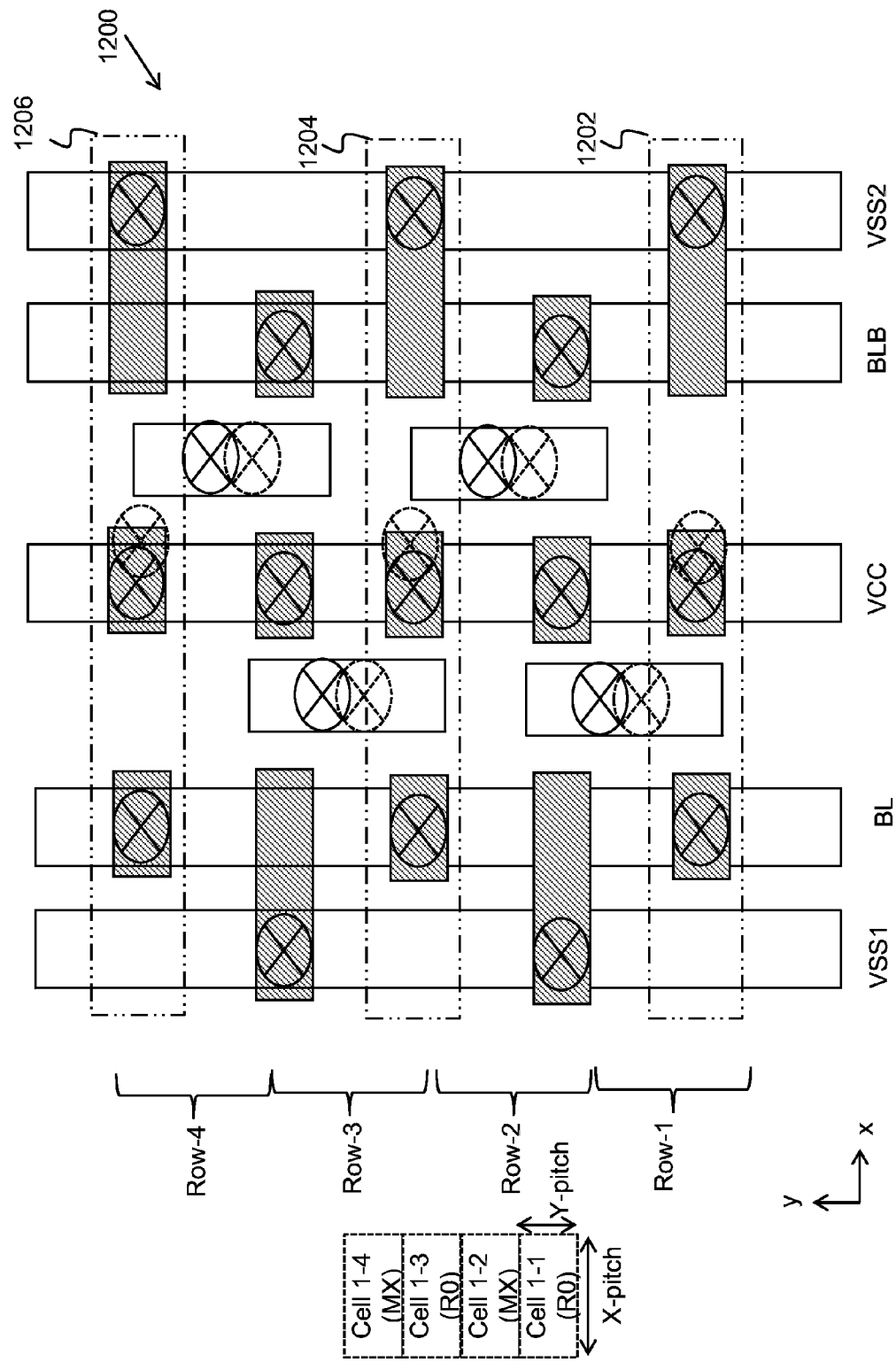
FIG. 12 illustrates a layout diagram of an SRAM array having four rows and one column in accordance with another embodiment.

FIG. 12 illustrates a layout diagram of an SRAM array having four rows and one column in accordance with another embodiment. The layout diagram of the SRAM array 1200 in FIG. 12 is similar to that of the SRAM array 1000 shown in FIG. 10 except that a plurality of second voltage supply lines are employed. The second voltage supply lines is formed in the third interconnect layer M3. As shown in FIG. 12, the second voltage supply line 1202 is formed in the first row. There are a third via coupled between the second voltage supply line 1202 and the first power source line VCC formed in the second interconnect layer M2.

Likewise, second voltage supply lines 1204 and 1206 are formed in the third interconnect layer M3. Two third vias couple the second voltage supply lines 1204 and 1206 with the first power source line VCC. An advantageous feature of having the second voltage supply lines is that the second voltage supply lines further reduce the resistance as well as the voltage drop of the SRAM circuit so that the function and speed of the SRAM array may be improved as a result.

Figure 13:
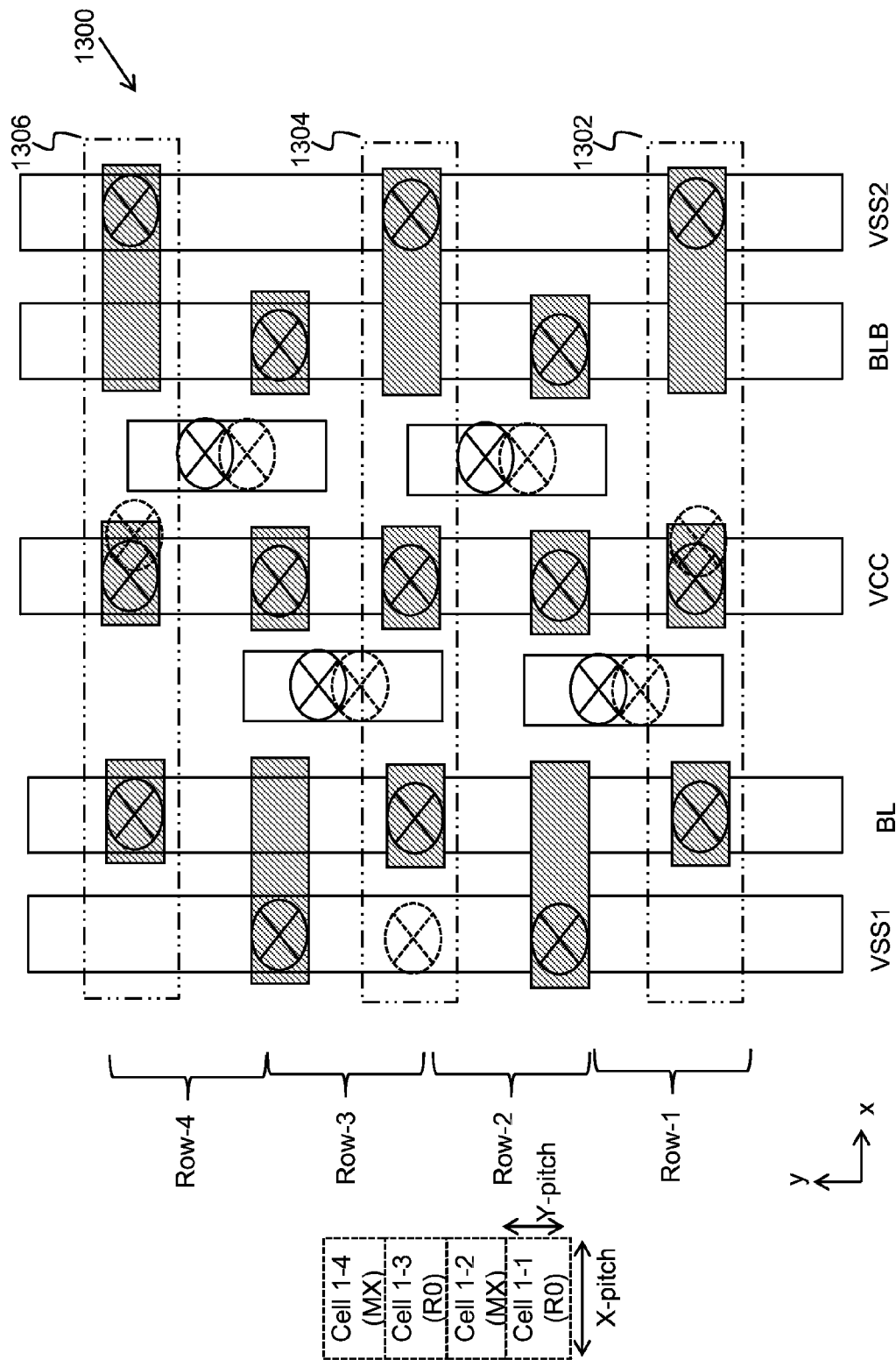
FIG. 13 illustrates a layout diagram of an SRAM array having four rows and one column in accordance with another embodiment.

FIG. 13 illustrates a layout diagram of an SRAM array having four rows and one column in accordance with another embodiment. The layout diagram of the SRAM array 1300 in FIG. 13 is similar to that of the SRAM array 1000 shown in FIG. 10 except that both a second power source line and a third VSS line are employed. Both the second power source lines 1302 and 1306 and the third VSS line 1304 are formed in the third interconnect layer M3. It should be noted that the third VSS line and the second power source line are formed in an alternating manner.

The connection between the additional power source and VSS lines in the third interconnect layer M3 and their corresponding lines in the second interconnect layer M2 has been described above with respect to FIG. 11 and FIG. 12, and hence is not discussed in further detail to avoid unnecessary repetition.

Figure 14:
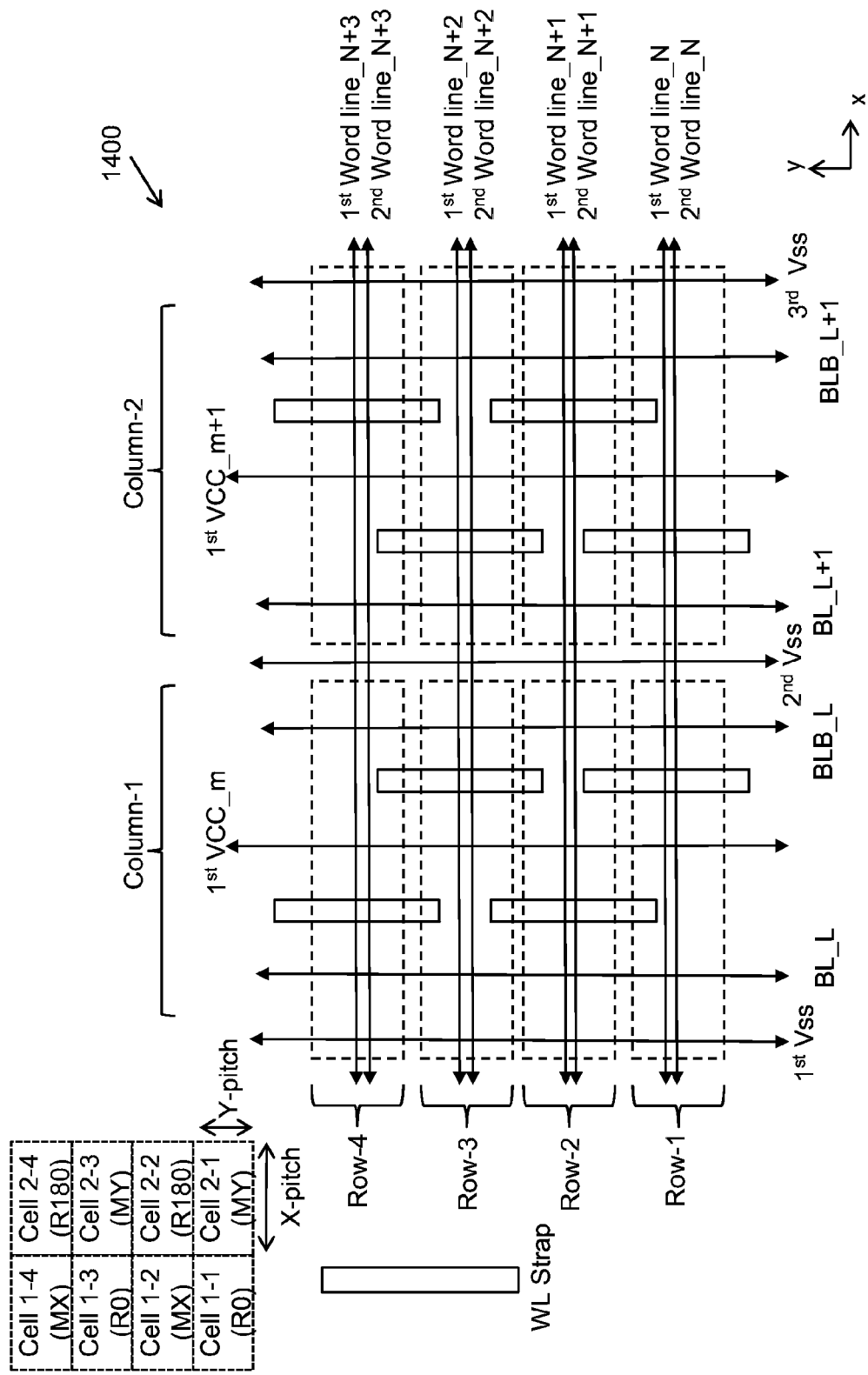
FIG. 14 illustrates a layout diagram of an SRAM array of four rows and two columns in accordance with an embodiment.

FIG. 14 illustrates a layout diagram of an SRAM array of four rows and two columns in accordance with an embodiment. Each SRAM cell of FIG. 14 is similar to the SRAM cell 700 shown in FIG. 7, and hence is not discussed in further detail herein. The SRAM array 1400 has two columns and four rows of SRAM cells. As shown in FIG. 14, word line strap structures of the first column are formed in the SRAM array in an alternating manner. In particular, in the first column, the word line strap structure is formed between the power source line VCC and the first bit line BL at the first row and the third row. In contrast, the word line strap structure is formed between the power source line VCC and the second bit line BLB at the second row and the fourth row.

On the other hand, the word line strap structures of two adjacent columns are formed in a mirror-symmetric manner. For example, as shown in FIG. 14, the word line strap structures of the first column and the word line strap structures of the second column are mirror-symmetric with respect to the second VSS line. In other words, when a word line strap structure is formed between the first bit line BL and the first power source line VCC, its corresponding word line strap structure in the adjacent column is formed between the second bit line BLB and the first power source line VCC. It should be noted in FIG. 14 the SRAM cells of adjacent columns may share a VSS line. For example, the second VSS line is share by the SRAM cells of the first column and the SRAM cells of the second column.

Figure 15:
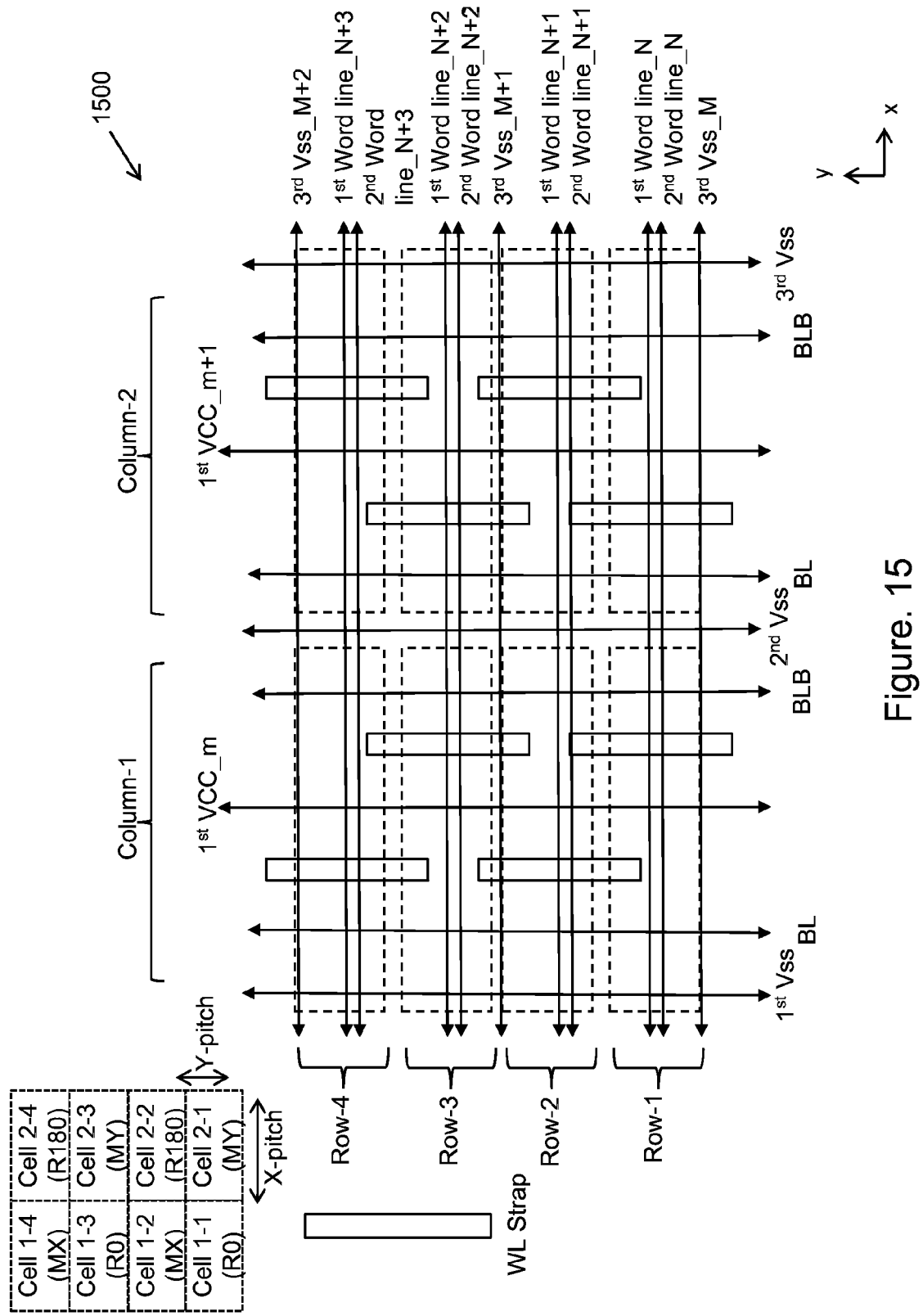
FIG. 15 illustrates a layout diagram of an SRAM array having four rows and two columns in accordance with another embodiment.

FIG. 15 illustrates a layout diagram of an SRAM array having four rows and two columns in accordance with another embodiment. The layout diagram of the SRAM array 1500 in FIG. 15 is similar to that of the SRAM array 1400 shown in FIG. 14 except that a plurality of third VSS lines are employed. The third VSS lines of an SRAM array have been described above with respect to FIG. 11, and hence are not discussed in further detail to avoid unnecessary repetition.

Figure 16:
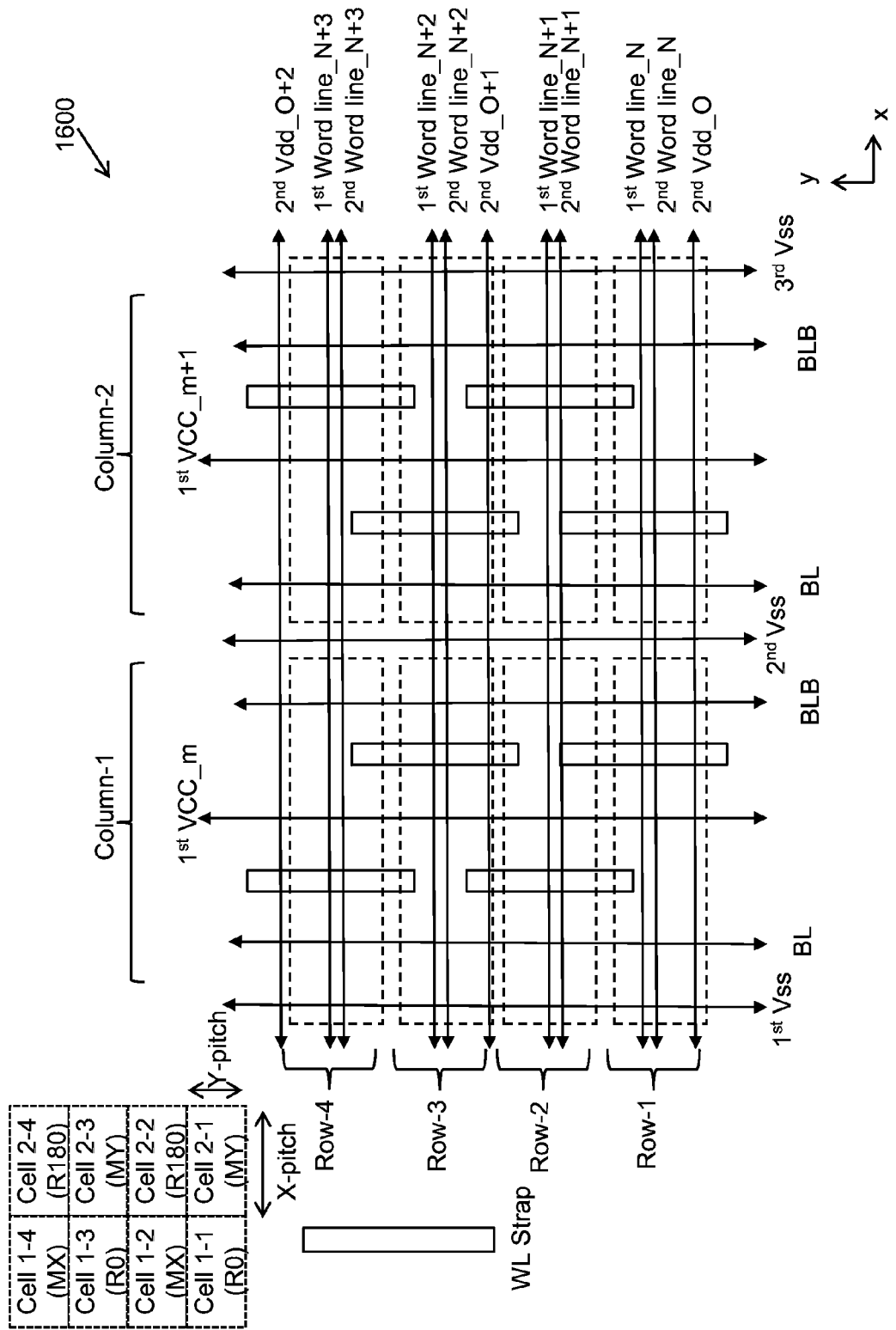
FIG. 16 illustrates a layout diagram of an SRAM array having four rows and two columns in accordance with another embodiment.

FIG. 16 illustrates a layout diagram of an SRAM array having four rows and two columns in accordance with another embodiment. The layout diagram of the SRAM array 1600 in FIG. 16 is similar to that of the SRAM array 1400 shown in FIG. 14 except that a plurality of second power source lines VCC are employed. The second power source lines VCC of an SRAM array have been described above with respect to FIG. 12, and hence are not discussed in further detail to avoid unnecessary repetition.

Figure 17:
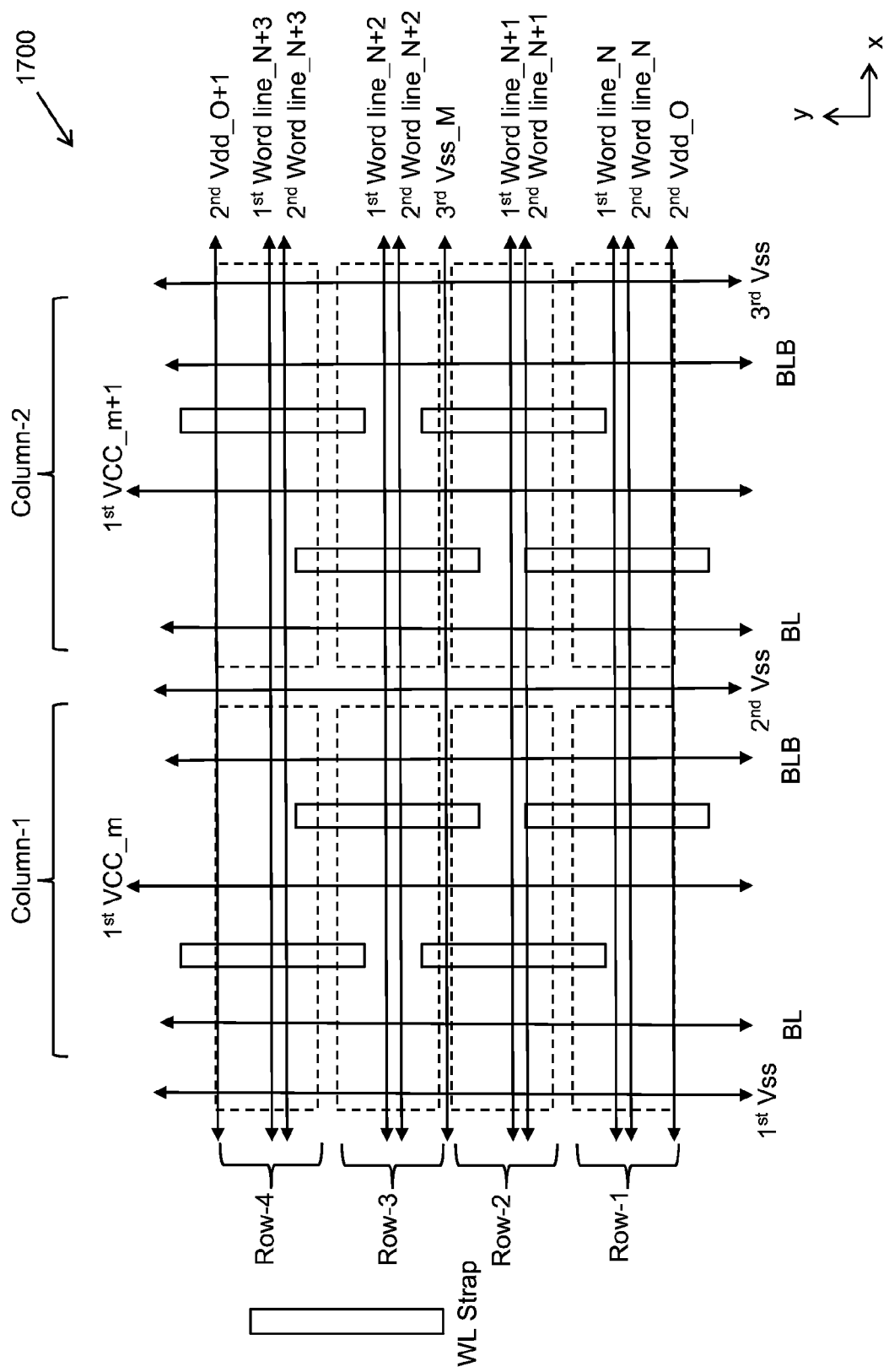
FIG. 17 illustrates a layout diagram of an SRAM array having four rows and two columns in accordance with another embodiment.

FIG. 17 illustrates a layout diagram of an SRAM array having four rows and two columns in accordance with another embodiment. The layout diagram of the SRAM array 1700 in FIG. 17 is similar to that of the SRAM array 1400 shown in FIG. 14 except that both the third VSS line and the second power source line VCCs are employed. Adding additional VSS lines and VCC lines in an SRAM array has been described above with respect to FIG. 14, and hence are not discussed in further detail to avoid unnecessary repetition.

Figure 18:
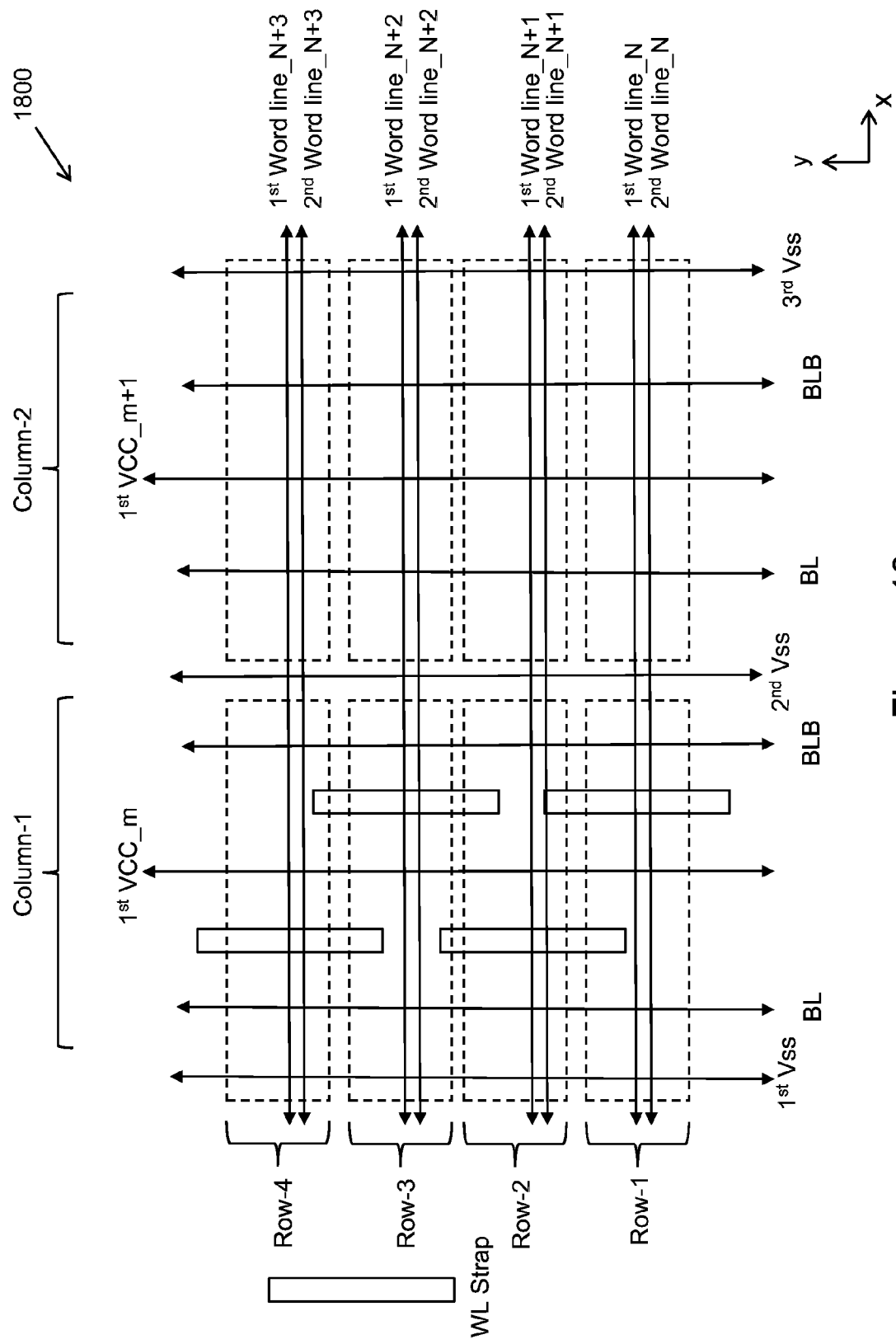
FIG. 18 illustrates a layout diagram of an SRAM array having four rows and two columns in accordance with another embodiment.

FIG. 18 illustrates a layout diagram of an SRAM array having four rows and two columns in accordance with another embodiment. The layout diagram of the SRAM array 1800 in FIG. 18 is similar to that of the SRAM array 1400 shown in FIG. 14 except that word line strap structures are employed in one column of two adjacent columns. As shown in FIG. 18, there may be a plurality of word line strap structures formed in the first column of the SRAM array. In contrast, there are no word line strap structures formed in the second column of the SRAM array 1800. It should be noted that in an SRAM array having a plurality of columns, word line strap structure may be formed in a few columns. For example, in order to reduce the voltage drop between two different word lines, word line strap structures may be formed in one column from every 4 to 32 columns.

Figure 19:
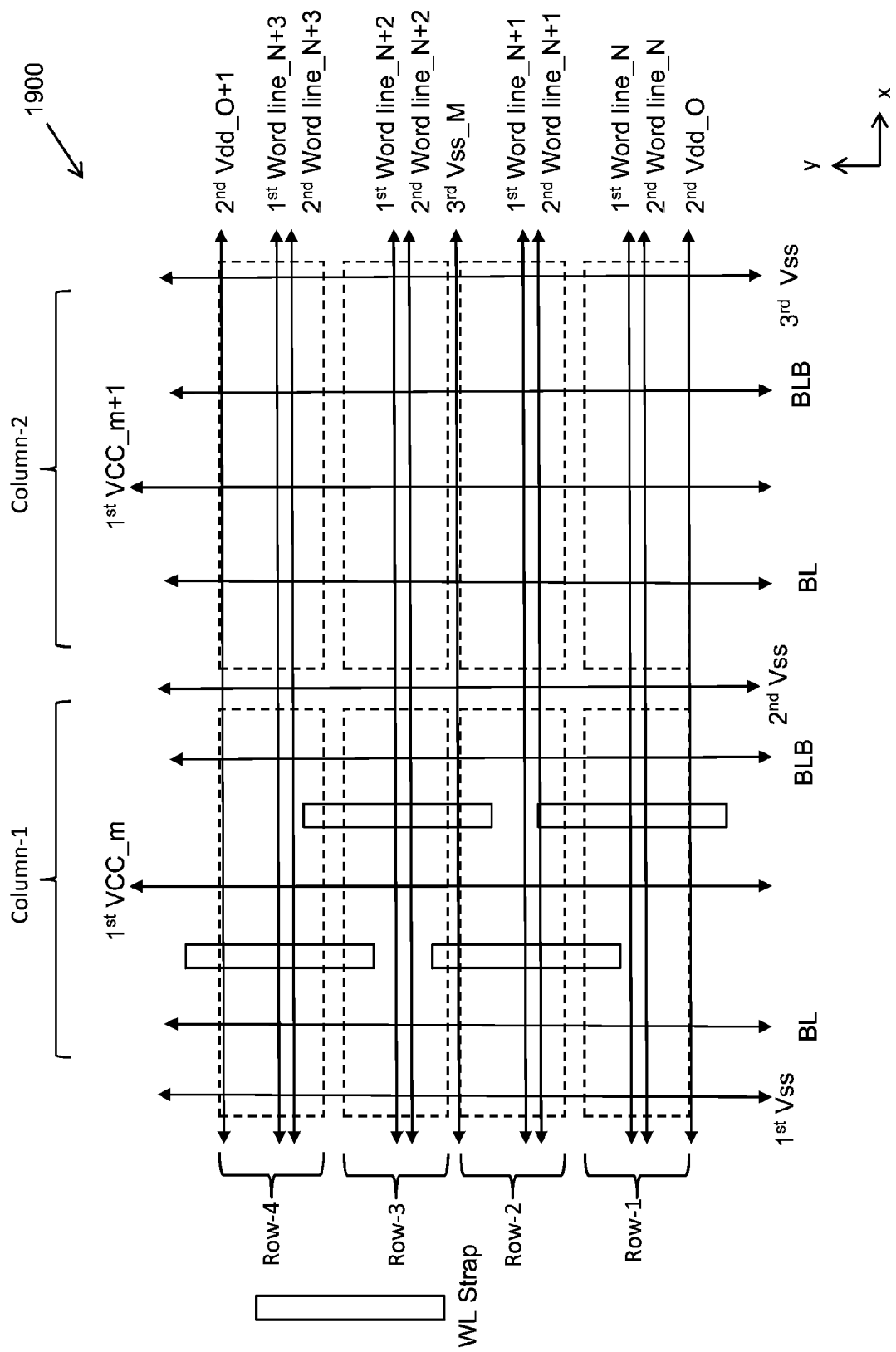
FIG. 19 illustrates a layout diagram of an SRAM array having four rows and two columns in accordance with another embodiment.

FIG. 19 illustrates a layout diagram of an SRAM array having four rows and two columns in accordance with another embodiment. The layout diagram of the SRAM array 1900 in FIG. 19 is similar to that of the SRAM array 1800 shown in FIG. 18 except that both the third VSS line and the second power source line VCCs are employed. Adding additional VSS lines and VCC lines in an SRAM array has been described above with respect to FIG. 14, and hence are not discussed in further detail to avoid unnecessary repetition.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An apparatus comprising:
a dielectric layer comprising a gate structure;
a first word line formed in a first metal layer, wherein the first word line extends in a first direction and the first metal layer is formed over the dielectric layer and in direct contact with the dielectric layer;
a first VSS line, a first bit line, a first power source line, a second bit line and a second VSS line formed in a second metal layer, wherein the first VSS line, the first bit line, the first power source line, the second bit line and the second VSS line extend parallel in a second direction;
a second word line formed in a third metal layer, wherein the second word line extends in the first direction; and
a word line strap structure, wherein the word line strap structure comprises:
a first via formed on the first word line;
a metal line formed in the second metal layer, wherein the metal line extends in the second direction; and
a second via formed on the metal line, wherein the first via, the metal line and the second via form a conductive path between the first word line and the second word line.

2. The apparatus of claim 1, wherein the first direction is perpendicular to the second direction.

3. The apparatus of claim 1, further comprising an SRAM cell, wherein the SRAM cell comprises:
a first inverter comprising:
a first p-type transistor (PU); and
a first n-type transistor (PD), wherein the first PU is connected in series with the first PD;
a second inverter cross-coupled to the first inverter comprising:
a second PU; and
a second PD, wherein the second PU is connected in series with the second PD;
a first pass-gate transistor, wherein the first pass-gate transistor is coupled between the first inverter and the first bit line; and
a second pass-gate transistor, wherein the second pass-gate transistor is coupled between the second inverter and the second bit line.

4. The apparatus of claim 3, wherein:
the first PU, the first PD, the second PU, the second PD, the first pass-gate transistor and the second pass-gate transistor are formed by FinFETs.

5. The apparatus of claim 3, wherein:
the first PU and the second PU are formed by a single FinFET; and
the first PD, the second PD, the first pass-gate transistor and the second pass-gate transistor are formed by multiple FinFETs.

6. The apparatus of claim 1, further comprising:
a third VSS line formed in the third metal layer, wherein:
the third VSS line is electrically coupled to the first VSS line and the second VSS line; and
the third VSS line is shared by an adjacent cell.

7. The apparatus of claim 1, further comprising:
a second power source line formed in the third metal layer, wherein:
the second power source line is electrically coupled to the first power source line; and
the second power source line is shared by an adjacent cell.

8. The apparatus of claim 1, further comprising:
a third VSS line formed in the third metal layer, wherein:
the third VSS line is electrically coupled to the first VSS line and the second VSS line; and
a second power source line formed in the third metal layer, wherein:
the second power source line is electrically coupled to the first power source line, wherein the third VSS line and the second power source line are formed in parallel and arranged in an alternating manner.

9. A device comprising:
a first memory cell comprising:
a first word line formed in a first interconnect layer, wherein the first word line extends in a first direction;
a first VSS line, a first bit line, a first power source line, a second bit line and a second VSS line formed in a second interconnect layer, wherein the first VSS line, the first bit line, the first power source line, the second bit line and the second VSS line extend parallel in a second direction;
a second word line formed in a third interconnect layer, wherein the second word line extends in the first direction; and
a first word line strap structure, wherein the first word line strap structure comprises a metal line extending in the second direction, a first via underneath the metal line and a second via over the metal line, and wherein the first via and the second via are formed in an overlapping region between the metal line and the second word line, and wherein the first via is vertically aligned with the second via; and a second memory cell formed in a same column and adjacent to the first memory cell comprising:
a second word line strap structure formed between the power source line and the first bit line.

10. The device of claim 9, wherein the first word line strap structure comprises:
the first via formed on the first word line;
the metal line formed in a second interconnect layer; and
the second via formed on the metal line, wherein the first via, the metal line and the second via form a conductive path between the first word line and the second word line.

11. The device of claim 10, wherein:
the first direction is orthogonal to the second direction.

12. The device of claim 9, further comprising a third VSS line formed in the third interconnect layer, wherein:
the third VSS line is electrically coupled to the first VSS line and the second VSS line; and
the third VSS line is shared by the first memory cell and the second memory cell.

13. The device of claim 9, further comprising a second power source line formed in the third interconnect layer, wherein:
the second power source line is electrically coupled to the first power source line; and
the second power source line is shared by the first memory cell and the second memory cell.

14. The device of claim 9, further comprising:
a third VSS line formed in the third interconnect layer, wherein:
the third VSS line is electrically coupled to the first VSS line and the second VSS line; and
a second power source line formed in the third interconnect layer, wherein:
the second power source line is electrically coupled to the first power source line, wherein the third VSS line and the second power source line are formed in parallel and arranged in an alternating manner.

15. A memory array comprising:
a first column comprising a plurality of memory cells, wherein the first column comprises:
a first memory cell comprising:
a dielectric layer comprising a gate structure;
a first word line formed in a first interconnect layer, wherein the first word line extends in a first direction and the first interconnect layer is formed over the dielectric layer and in direct contact with the dielectric layer;
a first VSS line, a first bit line, a first power source line, a second bit line and a second VSS line formed in a second interconnect layer, wherein the first VSS line, the first bit line, the first power source line, the second bit line and the second VSS line extend parallel in a second direction;
a second word line formed in a third interconnect layer, wherein the second word line extends in the first direction, and wherein at least a portion of the second word line overlaps with a portion of the first word line; and
a first word line strap structure formed between the power source line and the second bit line; and
a second memory cell formed in a same column and adjacent to the first memory cell comprising:
a second word line strap structure formed between the power source line and the first bit line; and
a second column formed adjacent to the first column, wherein the first column and the second column share the second VSS line.

16. The memory array of claim 15, wherein:
the first word line strap structure and the second word line strap structure are formed in one column of every 4 to 32 columns.

17. The memory array of claim 15, further comprising:
a third VSS line formed in the third interconnect layer, wherein:
the third VSS line is electrically coupled to the first VSS line and the second VSS line; and
a second power source line formed in the third interconnect layer, wherein:
the second power source line is electrically coupled to the first power source line, wherein the third VSS line and the second power source line are formed in parallel and arranged in an alternating manner.

18. The memory array of claim 15, further comprising:
two cross-coupled inverters having a data storage node and a data bar storage node; and
a first pass-gate device and a second pass-gate device coupled to the cross-coupled inverters.

19. The memory array of claim 18, wherein the cross-coupled inverters comprises:
a first p-type transistor (PU);
a first n-type transistor (PD), wherein the first PU is connected in series with the first PD;
a second PU; and
a second PD, wherein the second PU is connected in series with the second PD.

20. The memory array of claim 19, wherein:
the first PU, the first PD, the second PU, the second PD, the first pass-gate device and the second pass-gate device are formed by FinFETs.

* * * * *